United States Patent
Gaboury et al.

(10) Patent No.: US 7,132,899 B1
(45) Date of Patent: Nov. 7, 2006

(54) METHOD AND APPARATUS FOR PROVIDING AN IMPROVED HIGH SPEED BUFFER

(75) Inventors: Michael J. Gaboury, Burnsville, MN (US); Matthew L. Bibee, Bloomington, MN (US)

(73) Assignee: Xilinx, Inc., San Jose, CA (US)

( * ) Notice: Subject to any disclaimer, the term of this patent is extended or adjusted under 35 U.S.C. 154(b) by 39 days.

(21) Appl. No.: 10/972,099

(22) Filed: Oct. 22, 2004

(51) Int. Cl.
*H03B 1/00* (2006.01)

(52) U.S. Cl. .................... 331/77; 331/74; 331/15; 327/553

(58) Field of Classification Search .............. 331/15, 331/17, 77, 74; 327/553
See application file for complete search history.

(56) References Cited

U.S. PATENT DOCUMENTS

| | | | |
|---|---|---|---|
| 6,424,230 B1 * | 7/2002 | Kocaman et al. | 331/15 |
| 6,987,423 B1 * | 1/2006 | Brueske et al. | 331/36 C |
| 2003/0062883 A1 * | 4/2003 | Yokogawa et al. | 323/312 |

* cited by examiner

*Primary Examiner*—Joseph Chang
(74) *Attorney, Agent, or Firm*—LeRoy D. Maunu

(57) ABSTRACT

A method and apparatus for providing a high speed buffer with high gain bandwidth and rail-to-rail operation is disclosed. Resistor-capacitor (RC) filters are added in current mirrors that are in the signal path. The effect of these filters is to create a frequency-dependent impedance that extends the gain bandwidth of the circuit.

15 Claims, 5 Drawing Sheets

METHOD AND APPARATUS FOR PROVIDING AN IMPROVED HIGH SPEED BUFFER

FIELD OF THE INVENTION

This disclosure relates in general to electronic circuits, and more particularly to a method and apparatus for providing an improved high speed buffer.

BACKGROUND

In the design and manufacture of ASIC (Application specific integrated circuit) chips and microprocessor chips it is conventional practice to provide the chip designer with a library of conventional circuits from which to chose and generate his/her design. The chip designer chooses from this library the necessary circuits and connects them to form the desired chip configuration. In the case of microprocessors the designs and parameters of the library circuits are fixed thus imposing certain constraints on the chip designer. In the case of ASIC chips not only are the designs fixed but also the rules of wiring are fixed thus imposing additional constraints. Thus the designer is constrained by the circuit design and in the case of ASIC chips the rules in using the various circuits.

One of the library circuits that can be used by a chip designer is a phase locked loop circuit. Phase locked loops (PLLs) are widely used in many different applications. They are used to perform two or three different functions. A principal function is to lock or align the output clock of a circuit with the clock input. Another function is to multiply (i.e. increase) or divide (i.e. decrease) the output frequency of a circuit with respect to the input frequency. Another function of a phase locked loop is to provide clock recovery, i.e. to attenuate the input jitter associated with input signals and recover clock from jittery input data.

Local oscillators are well known devices and have been used in many applications, including PLLs. Most local oscillators are single ended or differential CMOS, e.g., single ended CMOS, differential CMOS and bipolar. As networking and communication systems are playing increasingly more important roles in the present information age, demands for high speed local oscillators are significantly increased to keep up with the speed of these systems.

One of the difficult elements of a PLL is the buffer circuit used to take the outputs from a local oscillator and produce a signal which is nearly rail-to-rail and can drive a load consisting of divider circuits and possibly fan outs to other digital circuits. This means that the circuit requires a high gain bandwidth to support the frequency of operation and also the gain required to get the signal from what is normally much less than full rail to as close to rail-to-rail as possible.

It can be seen then that there is a need for a method and apparatus for providing a high speed buffer with high gain bandwidth and rail-to-rail operation.

SUMMARY

To overcome the limitations described above, and to overcome other limitations that will become apparent upon reading and understanding the present specification, embodiments of the present invention discloses a method and apparatus for providing a high speed buffer with high gain bandwidth and rail-to-rail operation.

An exemplary embodiment of the present invention solves the above-described problems by providing a buffer that selectively adds resistor-capacitor (RC) filters in current mirrors that are in the signal path. The effect of these filters is to create a frequency-dependent impedance that extends the gain bandwidth of the circuit.

A system in accordance with an embodiment of the present invention includes a differential amplifier including a differential input terminal, at least one current mirror circuit, coupled to the differential amplifier in the signal path, for regulating amplifier current and at least one low pass filter, disposed in the at least one current mirror circuit, for extending a gain bandwidth of the amplifier.

In another embodiment of the present invention, a phase locked loop is provided. The phase locked loop includes a phase/frequency detector for generating an error signal representing a difference between a reference signal and a feedback signal, a current control oscillator, coupled to the phase detector, for generating an output signal having a frequency controlled by the error signal and a buffer, coupled to the current controlled oscillator, for isolating the current controlled oscillator from external circuits and providing the feedback signal to the phase detector, the buffer further including a differential amplifier including a differential input terminal, at least one current mirror circuit, coupled to the differential amplifier in the signal path, for regulating amplifier current and at least one low pass filter, disposed in the at least one current mirror circuit, for extending a gain bandwidth of the amplifier.

In another embodiment of the present invention, a method for providing an improved high speed buffer is provided. The method includes forming a buffer amplifier circuit, forming current mirrors in the signal path of the amplifier circuit for regulating amplifier current, and providing a low pass filter in the current mirrors in the signal path.

In another embodiment of the present invention, another buffer is provided. This buffer includes means for amplifying input signals, means, coupled to the means for amplifying in a signal path thereof, for regulating current in the means for amplifying and means, disposed in the means for regulating current, for extending a gain bandwidth of the amplifier.

In another embodiment of the present invention, another phase locked loop is provided. This phase locked loop includes means for generating an error signal representing a difference between a reference signal and a feedback signal, means, coupled to the means for generating an error signal, for generating an output signal having a frequency controlled by the error signal and means, coupled to the means for generating an output signal, for isolating the means for generating an output signal from external circuits and providing the feedback signal to the means for generating an error signal, the means for isolating further including means for amplifying input signals, means, coupled to the means for amplifying in a signal path thereof, for regulating current in the means for amplifying and means, disposed in the means for regulating current, for extending a gain bandwidth of the amplifier.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION

In the following description of the embodiments, reference is made to the accompanying drawings that form a part hereof, and in which is shown by way of illustration the specific embodiments in which the invention may be practiced. It is to be understood that other embodiments may be utilized because structural changes may be made without departing from the scope of the present invention.

Embodiments of the present invention provide a method and apparatus for providing a high speed buffer with high gain bandwidth and rail-to-rail operation. An exemplary embodiment of the present invention solves the above-described problems by providing a buffer that selectively adds resistor-capacitor (RC) filters in current mirrors that are in the signal path. The effect of these filters is to create a frequency-dependent impedance that extends the gain bandwidth of the circuit.

Figure 1:
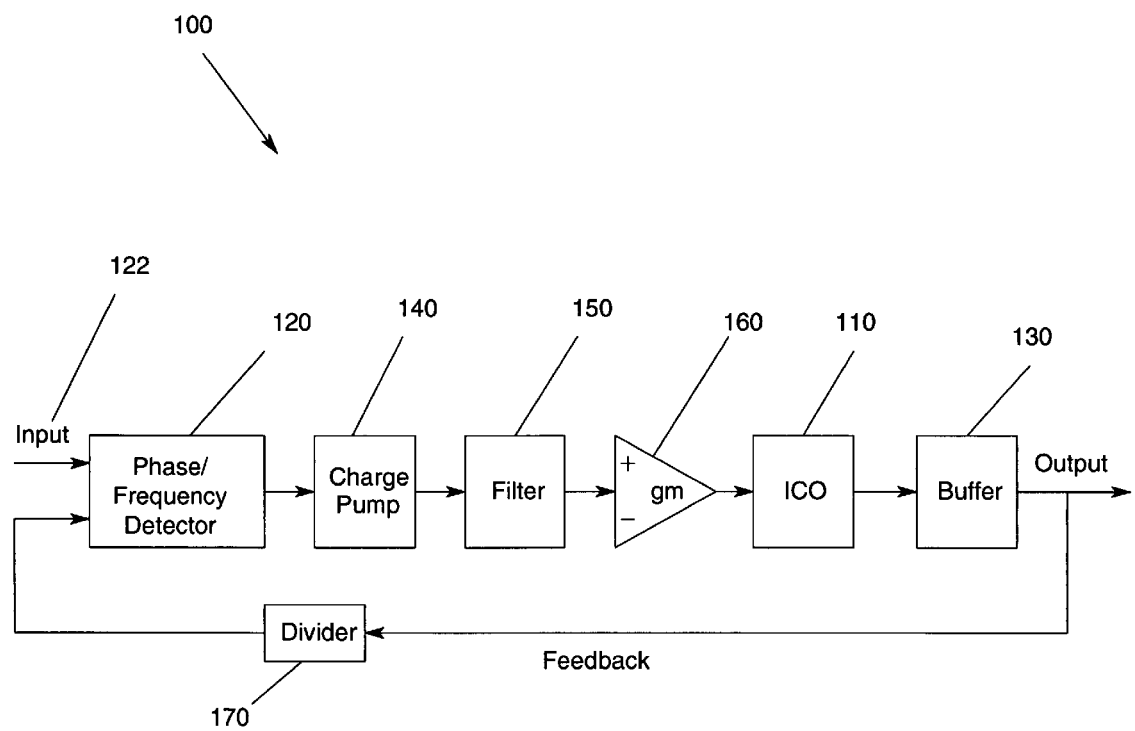
FIG. 1 illustrates a Phase Locked Loop (PLL) 100 according to an embodiment of the present invention.

FIG. 1 illustrates a Phase Locked Loop (PLL) 100 according to an embodiment of the present invention. The PLL 100 synchronizes a local oscillator 110 with a remote oscillator or signal source. This ensures that the output of the local oscillator 110 is at the same frequency and in phase with the remote signal. The local oscillator 110 may be a current controlled oscillator (ICO). This means that the frequency output of the ICO 110 is controlled by varying a current input. The output signal of the ICO 110 is fed back to a phase/frequency detector 120 via a buffer 130. The buffer 130 isolates the ICO 110 from the loading, e.g., caused by the detector 120, divider 170 and external circuits. Thus, the buffer 130 avoids "pulling" of the oscillator frequency.

The second input to the phase/frequency detector 120 is the reference signal 122, which has a frequency that the ICO 110 locks to. If there is a difference in frequency or phase between the two inputs at the phase/frequency detector 120, then an error signal is produced at the output of the phase/frequency detector 120. This error signal is fed to the ICO 110 via a charge pump 140, a filter 150 and transconductance amplifier 160 to produce an error correcting current. The filter 150 may include passive components or a passive component type filter. The filter allows for a static phase error of 0 volts assuming of course ideal matching of devices, etc. The transconductance amplifier 160 controls the current controlled oscillator 110. The phase/frequency detector 120 allows the phase locked loop 100 to lock to a wider range of signals on startup and recover if lock is lost from some large transients.

In one embodiment of the present invention, a divider 170 is disposed in the feedback path which allows several input reference frequencies to be used to generate the output frequency which is N times the input reference frequency (where N is the divider ratio). This allows flexibility in the application where some users already have a clock that is a sub-multiple of the required output frequency and don't want to add another one. In another embodiment of the present invention, the feedback path does not include divider 170 so the input and output clock frequencies are the same. This is the case in clock recovery applications say in a receiver. The transconductance amplifier 160 provides the current, which controls the ICO 110.

The buffer circuit 130 is used to take the outputs from an ICO 110 and produce a signal that is nearly rail-to-rail and can drive a load consisting of divider circuits and possibly fan outs to other digital circuits. This means that the buffer 130 requires a high gain bandwidth to support the frequency of operation and also the gain required to get the signal from what is normally much less than full rail to as close to rail-to-rail as possible.

Figure 2:
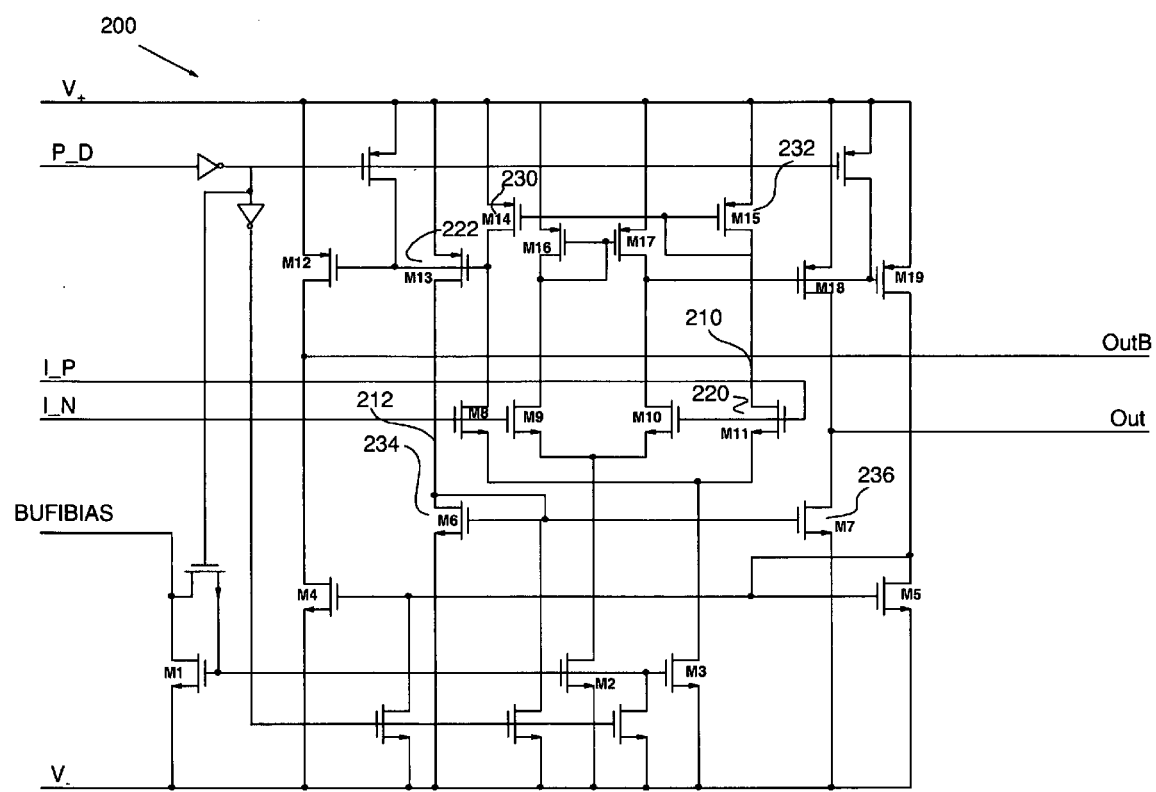
FIG. 2 shows a conventional buffer circuit.

FIG. 2 shows a conventional buffer circuit 200. In FIG. 2, the buffer circuit 200 includes a positive output path that includes a first stage. The first stage includes differential pair M9 and M10 that drive current mirror load of M16 and M17 and the negative output path. The negative output path includes differential pair M8 and M11 that drives the current mirror load of M15 and M14. The second stage positive output (Out) path includes pull up device M18 that is driven by the positive output of the first stage and the pull down device M7. Pull down device M7 is driven from the negative output path of the first stage through mirror devices M13 and M6. In a similar fashion the negative output of the second stage (OutB) is driven from the pull up device M12 and pull-down device M4 that is driven from the positive output path of the first stage through mirror devices M19 and M5.

The bandwidth of the circuit 200 is ultimately determined by a first 210 and second 212 pole. The poles 210, 212 are primarily determined by the output impedance devices M11 220 and M13 222 respectively and the capacitances of devices M14 230 and M15 232, and M6 234 and M7 236 respectively.

Figure 3:
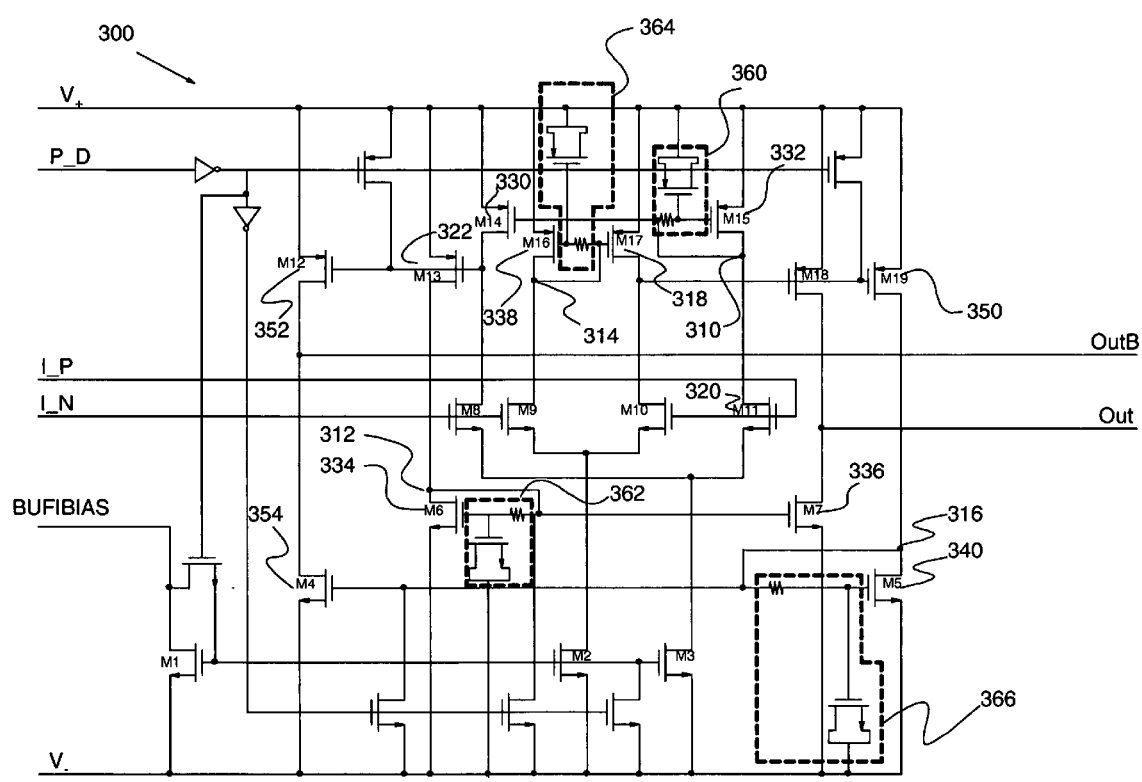
FIG. 3 illustrates a buffer circuit according to an embodiment of the present invention.

FIG. 3 illustrates a buffer circuit 300 according to an embodiment of the present invention. In FIG. 3, the buffer circuit 300 has been modified by selectively adding RC filters 360, 362, 364, 366 in the signal path. As discussed above, poles 310, 312 are primarily determined by the output impedance devices M11 320 and M13 322 respectively and the capacitances of devices M14 330 and M15 332, and M6 334 and M7 336 respectively. Therefore, a first low pass filter 360 is added between node 1 310 and the gate of transistor M15 332. A second low pass filter 362 is added between node 2 312 and the gate of M6 334. A third low pass filter 364 is added between node 3 314 and the gate of M16 338. A fourth low pass filter 366 is added between node 4 316 and the gate of M5 340.

The addition of the low pass filters 360, 362, 364, 366 provide two benefits. First, the effective capacitive loading of the gates of transistors M15 332, M6 334, M16 338, and M5 340 is significantly reduced thereby moving the effective poles out in frequency. The second benefit is that the mirror formed by transistors M14 330 M15 332, the mirror formed by transistors M6 334, M7 336, the mirror formed by transistors M16 338, M17 318, and the mirror formed by transistors M5 340, M4 354 now exhibit some high frequency amplitude peaking. The new low-pass filters 360, 362, 364, 366 increase the signal amplitude at the output and improve the impedance that extends the gain bandwidth of the circuit.

Figure 4:
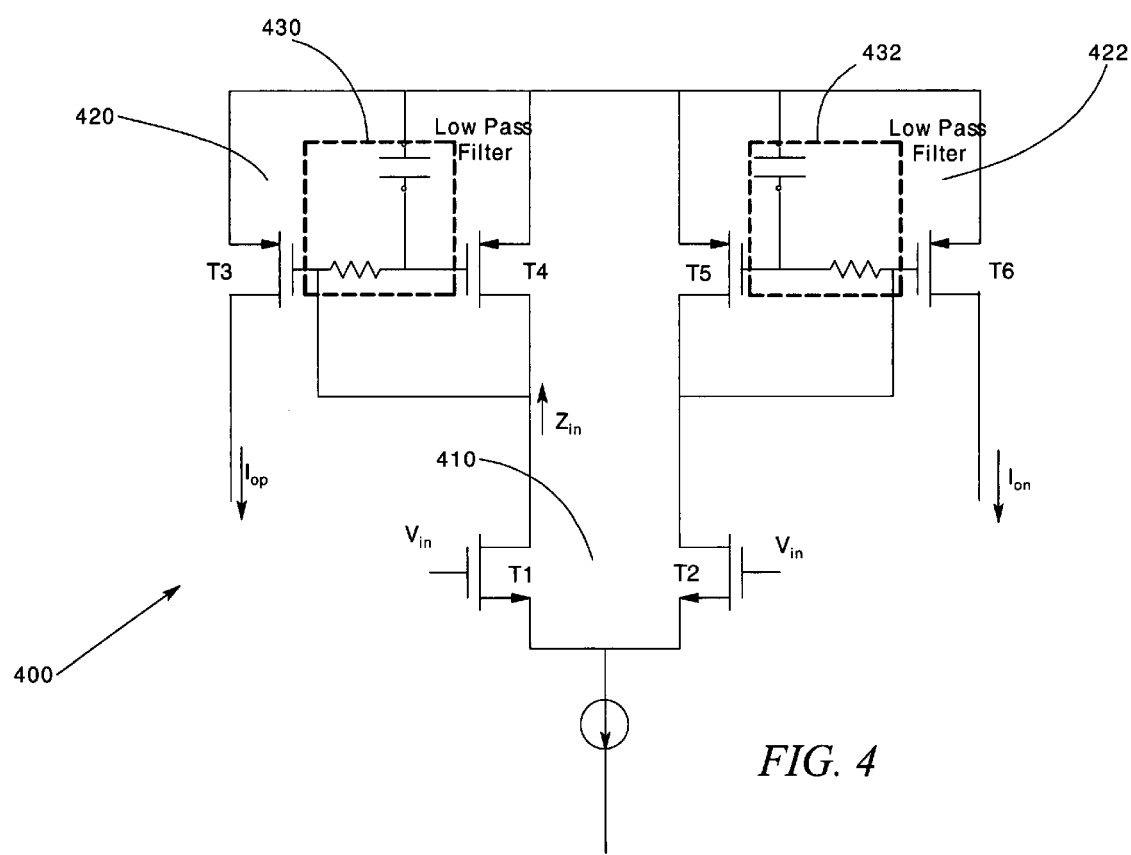
FIG. 4 is a simplified circuit diagram of a buffer according to the present invention.

FIG. 4 is a simplified circuit diagram 400 of a buffer according to the present invention. In FIG. 4, a differential amplifier 410, having transistors T1 and T2, receives a differential input signal. The differential amplifier transistors T1 and T2 drive current mirrors loads formed by T3, T4, and T5, T6, respectively. These current mirrors together with the low pass filters 430 and 432 form frequency dependent loads which amplify the output of the differential pair devices T1 and T2. In FIG. 4, low pass filters 430, 432 have been added to move the effective poles out in frequency and to provide high frequency amplitude peaking.

Figure 5:
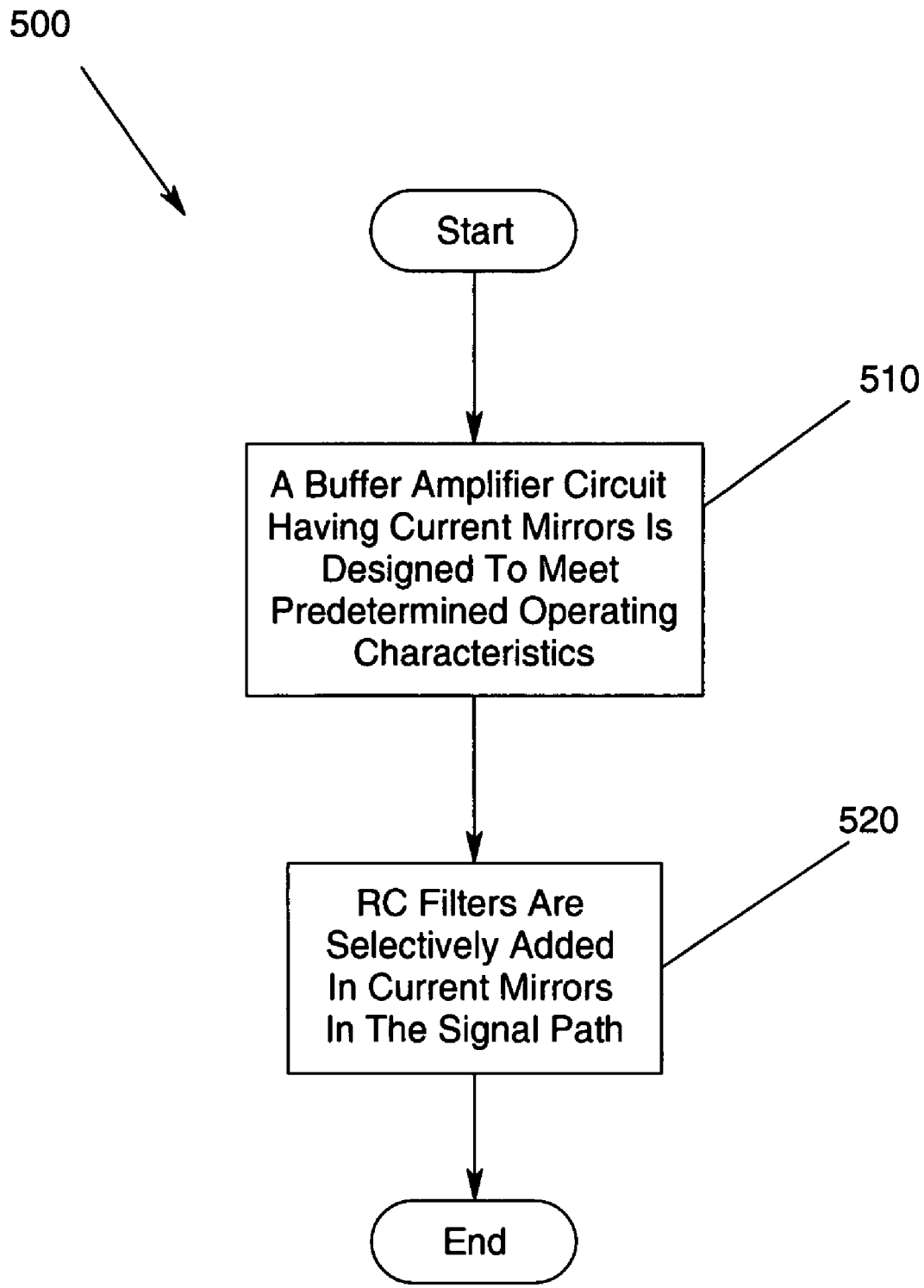
FIG. 5 is a flow chart of the method for providing a high speed buffer with high gain bandwidth and rail-to-rail operation according to an embodiment of the present invention.

FIG. 5 is a flow chart 500 of the method for providing a high speed buffer with high gain bandwidth and rail-to-rail operation according to an embodiment of the present invention. A buffer amplifier circuit having current mirrors is designed to meet predetermined operating characteristics 510. RC filters are selectively added in current mirrors in the signal path 520.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A buffer comprising:
 a differential amplifier including a differential input terminal;
 at least one current mirror circuit in the signal path and coupled to the differential amplifier and
 for each of the at least one current mirror circuit, a respective low pass filter for extending a gain bandwidth of the differential amplifier, the respective low pass filter coupled between a transistor of the current mirror and a node coupling the differential amplifier to the transistor of the current mirror; wherein the respective low pass filter includes a resistance and a capacitance, the resistance coupled between the node and a gate of the transistor of the current mirror, and the capacitance coupled between a rail and the gate of the transistor of the current mirror.

2. The buffer of claim 1, wherein the respective low pass filter provides a frequency dependent impedance for extending the gain bandwidth of the differential amplifier.

3. The buffer of claim 2, further comprising at least one output device, coupled to the at least one current mirror, for determining an output impedance.

4. The buffer of claim 3, wherein at least one pole is determined by the at least one current mirror and the at least one output impedance device.

5. The buffer of claim 4, wherein the respective low pass filter moves the at least one pole out in frequency.

6. The buffer of claim 1, wherein the respective low pass filter causes the current mirror to exhibit amplitude peaking at higher frequencies.

7. The buffer of claim 1, wherein the respective low pass filter comprises at least one RC filter circuit.

8. A phase locked loop, comprising:
 a phase/frequency detector for generating an error signal representing a difference between a reference signal and a feedback signal;
 a current control oscillator, coupled to the phase/frequency detector, for generating an output signal having a frequency controlled by the error signal; and
 a buffer, coupled to the current controlled oscillator, for isolating the current controlled oscillator from external circuits and providing the feedback signal to the phase/frequency detector, the buffer further comprising:
  a differential amplifier including a differential input terminal;
  at least one current mirror circuit in the signal path and coupled to the differential amplifier and
  for each of the at least one current mirror circuit, a respective low pass filter for extending a gain bandwidth of the differential amplifier, the respective low pass filter coupled between a transistor of the current mirror and a node coupling the differential amplifier to the transistor of the current mirror; wherein the respective low pass filter includes a resistance and a capacitance, the resistance coupled between the node and a gate of the transistor of the current mirror, and the capacitance coupled between a rail and the gate of the transistor of the current mirror.

9. The phase locked loop of claim 8, wherein the respective low pass filter provides a frequency dependent impedance for extending the gain bandwidth of the differential amplifier.

10. The phase locked loop of claim 8, further comprising at least one output device, coupled to the at least one current mirror, for determining an output impedance.

11. The phase locked loop of claim 10, wherein at least one pole is determined by the at least one current mirror and the at least one output impedance device.

12. The phase locked loop of claim 11, wherein the respective low pass filter moves the at least one pole out in frequency.

13. The phase locked loop of claim 8, wherein the respective low pass filter causes the current mirror to exhibit amplitude peaking at higher frequencies.

14. The phase locked loop of claim 8, wherein the low pass filter comprises at least one RC filter circuit.

15. A method for providing an improved high speed buffer, comprising:
 forming a buffer amplifier circuit;
 forming current mirrors in the signal path of the amplifier circuit for regulating an amplifier current; and
 providing a respective low pass filter in each of the current mirrors in the signal path, the respective low pass filter coupled between a transistor of the current mirror and a node that couples the amplifier current through the transistor of the current mirror; wherein the providing of the respective low pass filter in each of the current mirrors further comprises providing a resistance coupled between the node and a gate of the transistor of the current mirror and providing a capacitance coupled between a rail and the gate of the transistor of the current mirror.

\* \* \* \* \*